United States Patent
Schnell

(10) Patent No.: US 8,502,533 B2
(45) Date of Patent: Aug. 6, 2013

(54) COMBINED IMAGING SYSTEM, INCLUDING A MAGNETIC RESONANCE SYSTEM AND A UWB RADAR

(75) Inventor: Wilfried Schnell, Forchheim (DE)

(73) Assignee: Siemens Aktiengesellschaft, München (DE)

( * ) Notice: Subject to any disclaimer, the term of this patent is extended or adjusted under 35 U.S.C. 154(b) by 522 days.

(21) Appl. No.: 12/875,197

(22) Filed: Sep. 3, 2010

(65) Prior Publication Data
US 2011/0062958 A1 Mar. 17, 2011

(30) Foreign Application Priority Data
Sep. 11, 2009 (DE) .................. 10 2009 041 263

(51) Int. Cl.
*G01V 3/00* (2006.01)
(52) U.S. Cl.
USPC ........................................... 324/307
(58) Field of Classification Search
USPC .................... 324/300–322; 600/407–445
See application file for complete search history.

(56) References Cited

U.S. PATENT DOCUMENTS

| | | | | |
|---|---|---|---|---|
| 5,155,683 A | * | 10/1992 | Rahim | 701/25 |
| 5,504,714 A | * | 4/1996 | Shonting | 367/13 |
| 5,668,555 A | | 9/1997 | Starr | |
| 2011/0066027 A1 | * | 3/2011 | Schnell | 600/411 |

FOREIGN PATENT DOCUMENTS

| | | |
|---|---|---|
| DE | 102007057495 A1 | 6/2009 |
| EP | 0429190 A2 | 5/1991 |

OTHER PUBLICATIONS

F. Thiel, M.A. Hein, J. Sachs, U. Schwarz, F. Seifert; "Physiological signatures monitored by ultra-wideband-radar validated by magnetic resonance imaging", Proc. IEEE ICUWB 2008, vol. 1, pp. 105-108.

* cited by examiner

*Primary Examiner* — Brij Shrivastav

(57) ABSTRACT

In a combined imaging system, including a magnetic resonance system and a UWB radar, interference signals in the received signal of the one imaging system can be caused by the respective other imaging system. Therefore filters which contain in particular adaptive filters are used in order to filter out the interference signals caused in the received signal of the one system by the respective other system. By eliminating the mutually negative influence, the advantages can be completely exploited when operating the different imaging systems at the same time.

11 Claims, 2 Drawing Sheets

COMBINED IMAGING SYSTEM, INCLUDING A MAGNETIC RESONANCE SYSTEM AND A UWB RADAR

CROSS REFERENCE TO RELATED APPLICATIONS

This application claims priority of German application No. 10 2009 041 263.8 filed Sep. 11, 2009, which is incorporated by reference herein in its entirety.

FIELD OF THE INVENTION

The invention relates to a combined imaging system, including a magnetic resonance system and a UWB radar, for generating recordings of an examination region of an examination object. The invention also relates to a method for operating a combined imaging system of this type.

BACKGROUND OF THE INVENTION

Magnetic resonance tomography, also known as nuclear spin tomography, has become a wide spread technique for acquiring images of the insides of a living examination object. To obtain an image using this method, i.e. a magnetic resonance recording of an examination object, the body and/or the body part of the patient to be examined must initially be exposed to as homogeneous and static a base magnetic field as possible (generally referred to as $B_0$-field), which is generated by a base field magnet of the magnetic resonance system. During the recording of the magnetic resonance images, rapidly switching gradient fields for spatial encoding are superimposed onto this basic magnetic field, said gradient fields being generated by so-called gradient coils. Furthermore, HF signals, for instance a high frequency pulse or a high frequency pulse sequence, of a defined field strength are irradiated into the examination volume using a high frequency antenna, in which examination volume the examination object is located. This HF field (generally referred to as $B_1$ field) excites the nuclear spin of the atoms in the examination object such that they are moved from their equilibrium position, which runs parallel to the base magnetic field, and rotate about the direction of the base magnetic field. The magnetic resonance signals generated as a result are received by high frequency receiver antennae. The receiver antennae can either be the same antennae with which the high frequency pulses are emitted, or can be separate receiver antennae. The magnetic resonance images of the examination object are finally created on the basis of the received magnetic resonance signals. Each pixel in the magnetic resonance image is assigned here to a small body volume, a so=called "voxel", and each brightness or intensity value of the pixels is linked to the signal amplitude of the magnetic resonance signal received from this voxel.

A magnetic resonance system, which forms part of a combined imaging system according to the invention, is known for instance from the patent application DE 10 2007 057 495 A1.

A medical imaging method known as a "UWB radar" (ultra wideband radar) is also known, with which images of a living examination object can likewise be obtained. Here the examination object is irradiated with wideband electromagnetic low-power pulses, which penetrate into the examination object and are partially reflected onto boundary layers of tissue types with different dielectric properties. The UWB signal is herewith generated by a UWB signal generator and is radiated into the examination room by way of an antenna. A receiver antenna in conjunction with a receiving facility thereupon receives a UWB echo signal from different depths of the examination object. A display of these biological processes is possible by means of a movement of the boundary layers between the tissue types, which is caused by breathing or the heartbeat.

U.S. Pat. No. 5,668,555 discloses a UWB radar for examining an examination object, in which a pulse sequence is sent out to the examination object and the signals reflected thereupon by the examination object are received and evaluated. It is also possible on the basis of this measuring principle to generate image data from the examination object.

A combination of the two cited methods which form a combined imaging system is known from the publication F. Thiel, M. A. Hein, J. Sachs, U. Schwarz, F. Seifert: "Physiological signatures monitored by ultra-wideband-radar validated by magnetic resonance imaging", Proc. WEE ICUWB 2008, vol. 1, pp 105-108.

The combination of the two imaging methods enables examinations to be carried out in real-time on living examination objects and the heartbeat or the breathing to be displayed for instance.

A combined imaging system comprising a magnetic resonance system and a UWB radar is disadvantageous in that the signals generated by the respective system can effect interferences in the received signal of the respective other signal.

SUMMARY OF THE INVENTION

With a combined imaging system, the object of the present invention is to reduce the interference signal caused in the received signal of the one system by the respective other system.

This object is achieved by a combined imaging system and a method for operating a combined imaging system according to the claims.

The combined imaging system includes a magnetic resonance system and a UWB radar, for generating recordings of an examination region of an examination object, with the magnetic resonance system including a high frequency facility for transmitting high frequency signals into the examination region and for receiving magnetic resonance signals emitted thereupon from the examination region, with the UWB radar including a radar signal facility for transmitting radar signals into the examination region and for receiving UWB echo signals reflected thereupon from the examination region and with imaging means being present for generating image data of the examination region based on the magnetic resonance signals and the UWB echo signals.

The operation of a magnetic resonance system can result in varying ways in interferences in a UVB radar operated in close proximity to the magnetic resonance system. In particular, the control signals for the gradient coil or the gradient fields generated by the gradient coil can effect interference signal parts in the UWB echo signal of the UWB radar. Similarly, the control signals of the high frequency antennae and the signals originating from the high frequency antennae can also generate interference signals in the UWB echo signal. Furthermore, during operation of a magnetic resonance system, the strong magnetic alternating fields frequently result in vibrations of individual components of the magnetic resonance system, for instance the tunnel walls or the patient support apparatus. Interferences in the UWB echo signal of the UWB radar are also effected as a result.

Conversely, interference signals effected by the UWB radar can also be contained in the magnetic resonance signal received by the magnetic resonance system.

To eliminate interference signals, the invention provides for the use of filter means, in order to filter out interference signal parts caused by the UWB radar in the magnetic resonance signal and/or by the magnetic resonance system in the UWB echo signal.

The filtering process improves the quality of the magnetic resonance signal received by the magnetic resonance system and/or the UWB echo signal received by the UWB radar.

The filter means are advantageously embodied as adaptive filters or include adaptive filters, which are able to automatically adjust themselves to different interference signals. Here, in accordance with an embodiment of the invention, the gradient coil signal and/or the high frequency antenna signal and/or the radar signal are fed to the filter means. This enables the filter parameters to be optimally adjusted in order to reduce the interference signal parts.

Furthermore, in one embodiment of the invention, vibration sensors are provided for detecting vibrations of components in the magnetic resonance system and the patient support apparatus. The sensor signals obtained therefrom are also advantageously fed to the filter means for optimized determination of filter parameters. As a result, interference signal parts in the UWB echo signals, which are effected by vibrations of components of the magnetic resonance system, can as a result be largely eliminated.

BRIEF DESCRIPTION OF THE DRAWINGS

The invention is described in more detail below with reference to an exemplary embodiment, in which.

DETAILED DESCRIPTION OF THE INVENTION

Figure 1:
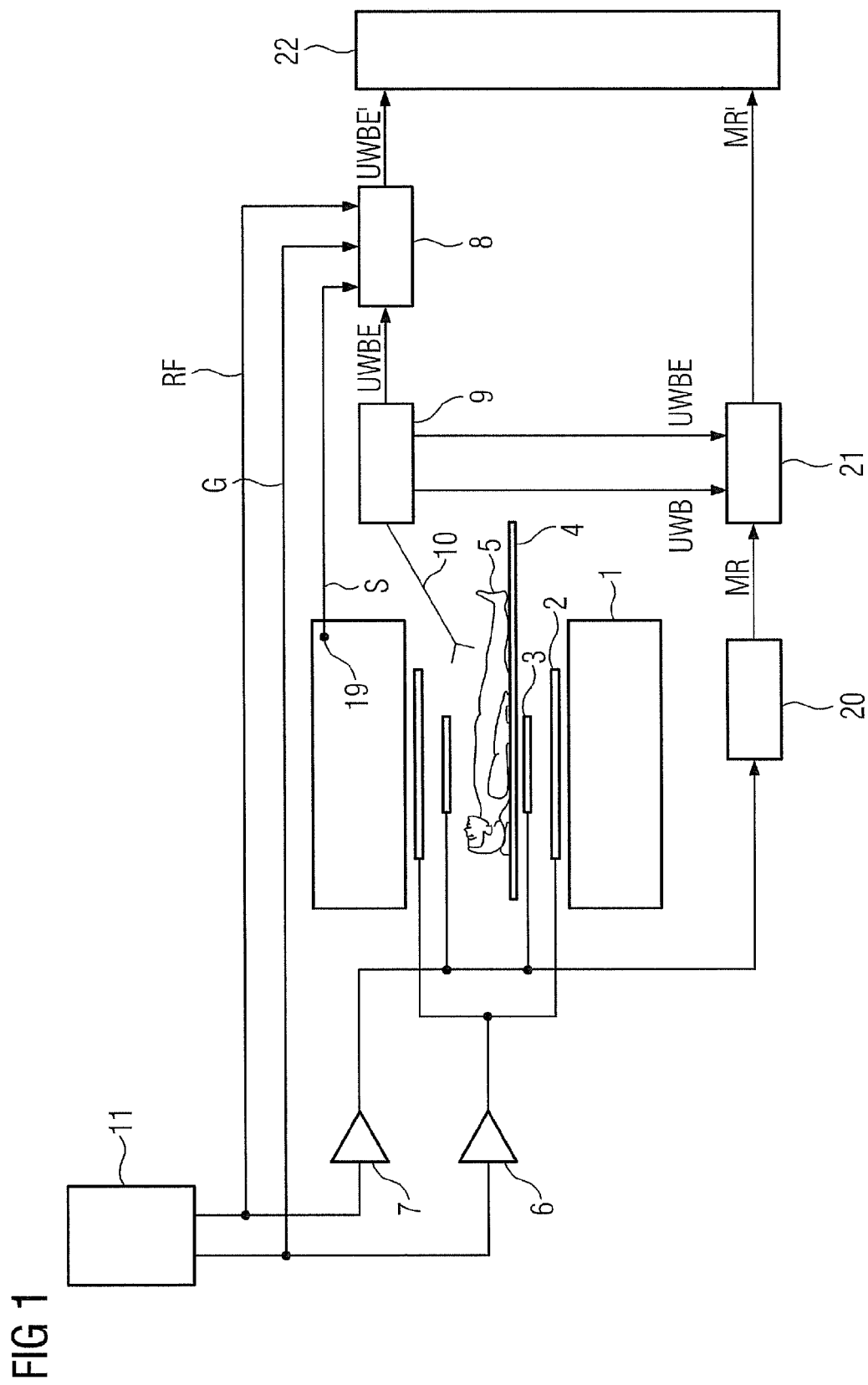
FIG. 1 shows a combined imaging system having a magnetic resonance system and a UWB radar in a very simplified, schematic representation

FIG. 1 shows a very simplified schematic representation of the essential components of a combined imaging system, which includes a magnetic resonance system and a UWB radar. Here the magnetic resonance system comprises an essentially hollow cylindrical base unit 1, in the cavity of which is located a patient recording space (a gantry). A patient support apparatus 5, on which a patient 5 to be examined rests, can be moved into the gantry. To examine the patient 5 with the magnetic resonance system, an electrical gradient pulse signal G is generated by means of a signal generator 11 and a gradient pulse amplifier 6, amplified and fed to the gradient coils 2. These thereupon give off rapidly switching gradient fields. Furthermore, electrical high frequency pulse signals RF are generated by the signal generator 11 and a high frequency pulse amplifier 7, amplified and fed to high frequency pulse antennae 3. These thereupon radiate high frequency fields. As a result of this excitation, magnetic resonance signals are given off by the patient 5, received by the high frequency pulse antennae 3 and fed to an MR receiver unit 20. This converts the received signals into an electrical MR signal.

Furthermore, the combined imaging system includes a UWB radar 9 with a transmit and receive antenna 10. The UWB radar 9 generates a UWB signal and transmits this via the transmit and receive antenna 10 into the examination room. A resulting UWB echo signal is likewise detected from the examination room by way of the transmit and receive antenna 10 and an electrical UWB echo signal UWBE is obtained.

When operating the magnetic resonance system and the UWB radar at the same time, interference signal parts effected by the gradient coil 2 and by the high frequency pulse antenna 3 of the magnetic resonance system are present in the electrical UWB echo signal UBWE. Furthermore, vibrations in the tunnel walls of the magnetic resonance system, to which the transmit and receive antenna 10 of the UWB radar is fastened for instance, as well as vibrations of the patient support apparatus result in interference signal parts in the electrical UWB echo signal UWBE. According to the invention, the combined imaging system includes filter means for reducing and/or eliminating these interference signal parts.

Furthermore, the UWB signals generated by the UWB radar 9 and given off into the examination room can also effect interference signal parts in the MR signal obtained by the MR receiver unit 20 of the magnetic resonance system. In this respect, the invention also provides for filter means 21, in order to filter out interference signal parts from the MR signal.

Figure 2:
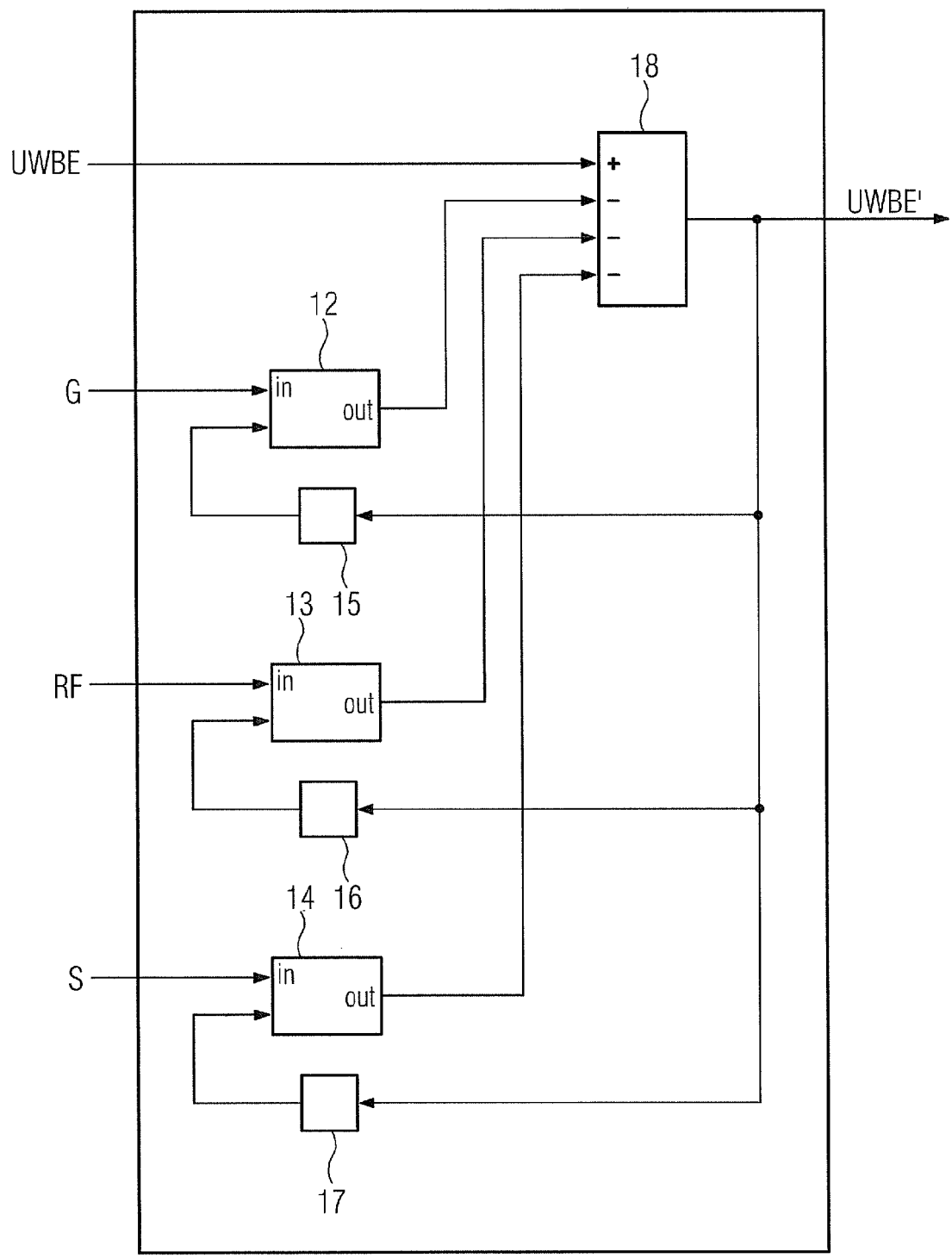
FIG. 2 shows a schematic representation of a filter for a UWB echo signal.

A schematic representation of the filter 8 for eliminating the interference signal parts contained in the electrical UWB echo signal UWBE is shown in FIG. 2. Here the electrical UWB echo signal UWBE received by the UWB radar 9 by way of the antenna 10 and if necessary further processed is fed to a filter 8 and in particular the positive input of a multiple subtractor 18. Interference signal parts caused by the magnetic resonance system are contained in this electrical UWB echo signal UWBE. Furthermore, the gradient pulse signal G, from which the signal for feeding the gradient coil 2 emerges after an amplification, and the high frequency pulse signal RF, from which the signal for feeding the high frequency pulse antennae 3 of the magnetic resonance system emerges, are also fed to the filter. Furthermore, a sensor signal S is also fed to the filter 8, said sensor signal being generated by a vibration sensor 10 fastened to or near to the base unit 1 of the magnetic resonance system. Adaptive filters 12, 13 and 14 within the filter 8 are adjusted such that the gradient coil pulse signal G filtered with the filter 12, the high frequency pulse signal RF filtered with the filter 13 and/or the sensor signal S filtered with the filter 14 are each subtracted from the electrical UWB echo signal, so that interference signal parts contained in the electrical UWB echo signal UWBE, which result from the gradient pulse coil signal G and/or the high frequency pulse signal RF and/or the vibrations of the base unit 1, are at least largely eliminated. To this end, the filtered signals G, RF and S are in particular fed to the negative inputs of the multiple subtractor 18.

The use of adaptive filters 12, 13 and 4 enables the filter settings to be automatically adjusted to changing "interference signals" G, RF and S. Furthermore, it is possible to influence the adaptation of the adaptive filters 12, 13 and 14 by means of the feedback control elements 15, 16 and 17. For instance, the adaptation speed can be controlled by the feedback control elements 15, 16 and 17, by the output signal UWBE' being multiplied therein with an adaptation factor. For instance, the ratio between accuracy and speed of the adaptation can thus be influenced. After filtering by means of the filter 8, the interference signal parts contained in the electrical UWB echo signal UWBE are at least largely eliminated in the resulting echo signal UWBE'. According to the same principle, further interference signals can also be eliminated from the wanted signal, said interference signals being effected by vibrations in the patient support apparatus for instance and being detected by way of a further sensor (not shown).

Similarly to the filter 8 described in more detail in FIG. 2, the filter 21 is also configured according to FIG. 1, as a result of which it is possible to dispense with a more accurate representation. Here the MR signal given off by the MR receiver unit appears in particular as a faulty input signal, from which the interference signal parts generated by the UWB radar 9, which originate from the UWB signal fed to the antenna 10 and/or from the resulting UWB echo signal, are filtered out. An interference signal-free and/or interference signal-reduced signal MR' results.

The interference signal-reduced and/or interference signal-free signals UWBE' and MR' are then fed to a signal processing unit 22 for further processing and in particular for image generation, said signal processing unit calculating image data from the signals.

The structure shown by way of example in FIG. 1 and/or the filter arrangement shown by way of example in FIG. 2 enables the negative mutual influence of the received signals to be at least largely eliminated when operating the different imaging systems at the same time in the case of a combined imaging system having a magnetic resonance system and a UWB radar. As a result, advantages which enable a combined operation of the two imaging systems can be completely exploited.

The invention claimed is:

1. A combined imaging system for generating a recording of an examination region of an examination object, comprising:
    a magnetic resonance system comprising a high frequency device for transmitting a high frequency signal into the examination region and for receiving a magnetic resonance signal emitted from the examination region;
    a UWB radar comprising a radar signal device for transmitting a radar signal into the examination region and for receiving a UWB echo signal reflected from the examination region;
    a filter for filtering out an interference signal in the magnetic resonance signal caused by the UWB radar and an interference signal in the UWB echo signal caused by the magnetic resonance system; and
    a signal processing unit for generating image data of the examination region based on the filtered magnetic resonance signal and the filtered UWB echo signal.

2. The combined imaging system as claimed in claim 1, wherein the filter comprises an adaptive filter.

3. The combined imaging system as claimed in claim 1, wherein the UWB signal is filtered out as a function of a gradient coil signal and/or the high frequency signal generated by the magnetic resonance system.

4. The combined imaging system as claimed in claim 1, wherein the magnetic resonance signal is filtered out as a function of the radar signal and/or the UWB echo signal.

5. The combined imaging system as claimed in claim 1, further comprising a mounting apparatus for mounting the examination object, wherein a mechanical oscillation of the mounting apparatus is detected, and wherein the UWB signal and the magnetic resonance signal are filtered out as a function of the detected oscillation.

6. The combined imaging system as claimed in claim 1, further comprising a transmit and/or receive antenna for transmitting the radar signal and/or for receiving the UWB echo signal, wherein a mechanical oscillation of the transmit and/or receive antenna is detected, and wherein the UWB signal and the magnetic resonance signal are filtered out as a function of the detected oscillation.

7. A method for operating a combined imaging system comprising a magnetic resonance system and a UWB radar for generating a recording of an examination region of an examination object, comprising:
    sending out a high frequency signal from the magnetic resonance system into the examination region;
    receiving a magnetic resonance signal emitted from the examination region by the magnetic resonance system;
    sending out a radar signal from the UWB radar into the examination region;
    receiving a UWB echo signal reflected from the examination region by the UWB radar;
    filtering out an interference signal in the magnetic resonance signal caused by the UWB radar and an interference signal in the UWB echo signal caused by the magnetic resonance system by a filter; and
    generating image data of the examination region based on the filtered magnetic resonance signal and the filtered UWB echo signal by a signal processing unit.

8. The method as claimed in claim 7, wherein the UWB echo signal is filtered our as a function of a gradient coil signal and/or the high frequency signal generated by the magnetic resonance system.

9. The method as claimed in claim 7, wherein the magnetic resonance signal is filtered out as a function of the radar signal and/or the UWB echo signal.

10. The method as claimed in claim 7, further comprising detecting a mechanical oscillation of a mounting apparatus for mounting the examination object, and wherein the UWB signal and the magnetic resonance signal are filtered out as a function of the detected oscillation.

11. The method as claimed in claim 7, further comprising detecting a mechanical oscillation of a transmit and/or receive antenna for transmitting the radar signal and/or for receiving the UWB echo signal, and wherein the UWB signal and the magnetic resonance signal are filtered out as a function of the detected oscillation.

* * * * *